US006184113B1

United States Patent
Seo et al.

(10) Patent No.: US 6,184,113 B1
(45) Date of Patent: Feb. 6, 2001

(54) METHOD OF MANUFACTURING A GATE ELECTRODE IN A SEMICONDUCTOR DEVICE

(75) Inventors: Hwan Seok Seo; Sang Hyeob Lee, both of Ichon (KR)

(73) Assignee: Hyundai Electronics Industries Co., Ltd. (KR)

( * ) Notice: Under 35 U.S.C. 154(b), the term of this patent shall be extended for 0 days.

(21) Appl. No.: 09/342,530

(22) Filed: Jun. 29, 1999

(30) Foreign Application Priority Data

Jun. 29, 1998 (KR) .................................................. 98-24719

(51) Int. Cl.⁷ ............................................... H01L 21/3205

(52) U.S. Cl. ........................ 438/585; 438/257; 438/587; 437/193

(58) Field of Search .................................... 438/585, 152, 438/258, 238, 257, 587, 622; 437/192, 193, 195, 200, 194

(56) References Cited

U.S. PATENT DOCUMENTS

| 3,910,804 | 10/1975 | Alcott | 148/188 |
|---|---|---|---|
| 5,116,774 | 5/1992 | Huang et al. | 437/40 |
| 5,447,875 | 9/1995 | Moslehi | 437/41 |
| 5,683,941 | * 11/1997 | Kao et al. | 437/200 |
| 5,688,706 | 11/1997 | Tseng | 437/45 |
| 5,700,719 | * 12/1997 | Yuzurihara et al. | 437/193 |
| 5,828,130 | 10/1998 | Miller et al. | 257/754 |
| 5,981,381 | * 11/1999 | Tanimoto et al. | 438/645 |

FOREIGN PATENT DOCUMENTS 58-18965    2/1983 (JP) ......................................... 29/78

* cited by examiner

Primary Examiner—David Nelms
Assistant Examiner—Phuc T. Dang
(74) Attorney, Agent, or Firm—Blakely Sokoloff Taylor & Zafman

(57) ABSTRACT

The present invention relates to a method for manufacturing a semiconductor device having a gate electrode (e.g. tungsten gate electrode) of low resistivity. In the method for manufacturing a semiconductor device, a conductive sacrifice polysilicon pattern is formed on a gate insulating film and then a first interlayer insulating film is deposited. The first interlayer insulating film is blank-etched so as to expose the surface of the sacrifice polysilicon pattern and then the exposed sacrifice polysilicon pattern is etched to form a recessed profile, in which, in the recessed portion, a predetermined thickness of sacrifice polysilicon pattern remains. On the surface of the remnant sacrifice polysilicon pattern in the recessed portion a metal film (e.g. a tungsten film) is selectively deposited. When selectively depositing of the metal film, most of remnant sacrifice polysilicon pattern is consumed. Preferably, prior to the formation of the tungsten film a pre-treatment or cleaning can be performed, using diluted HF, BOE or $BCl_3$. This method uses the thin sacrifice polysilicon pattern as the nucleated film for the tungsten deposition and as the buffer film for preventing the underlying gate insulating film and the underlying semiconductor substrate from being damaged by the fluorine of $WF_6$ during the tungsten deposition. In addition, the thickness of the sacrifice polysilicon pattern is controlled so that most of sacrifice polysilicon pattern is consumed during the tungsten deposition, thereby reducing the resistivity of the gate electrode substantially composed of metal such as tungsten only.

12 Claims, 3 Drawing Sheets

METHOD OF MANUFACTURING A GATE ELECTRODE IN A SEMICONDUCTOR DEVICE

BACKGROUND OF THE INVENTION

The present invention relates to a method for forming a gate electrode or word line in a highly integrated and high speed semiconductor device such as 1 giga bit or more DRAM.

Presently, the gate electrode of a semiconductor device is typically composed of a doped polysilicon only or a polycide including a doped polysilicon film and a tungsten silicide ($WSi_x$) sequentially deposited for reducing a resistivity thereof. However, the resistivity of tungsten silicide film is about 100 $\mu\Omega$•cm, so that it is still too high to be used in a 1 giga bit or more DRAM that generally requires a submicron technology (e.g. 0.18 $\mu$m or below linewidth fabrication technology). For example, in a MOS device, when the delay of an interconnect path is bigger than that of gate switching the device malfunctions. Accordingly, for the formation of a highly integrated and high performance of device, the resistivity of interconnect path (e.g. the interconnect path between the word line and the bit line in a DRAM) should be reduced as lower as possible. Therefore, the study related to a tungsten gate electrode (or word line) of 10 $\mu\Omega$•cm in resistivity has been continuously made.

In conventional methods of the formation of a tungsten gate electrode, a tungsten film or a polysilicon/tungsten film is deposited on a gate oxide and then selectively etched, using a gate electrode photoresist pattern to form a gate electrode. However, this conventional method has a disadvantage that the patterning for the gate electrode gives an attack to the gate oxide. Though the damage of the gate oxide can be recovered by re-oxidation process that is made for preventing the deterioration of the gate oxide and protecting the underlying semiconductor substrate during an ion implantation of LDD source/drain formation to be performed later, it causes another problems. That is, the re-oxidation makes a tungsten oxide film on the surface of gate electrode so that the overall resistivity of the gate electrode is rather increased and it destroys the gate (or word line) profile.

Also the boundary of the tungsten film and the gate oxide is so unstable that a separate glue layer may be required between the tungsten film and the gate oxide. However, since the glue layer is generally composed of the high resistivity of materials, the overall resistivity of the gate electrode is increased.

In addition, when the tungsten electrode is deposited by CVD (chemical vapor deposition) the fluorine element of source gas $WF_6$ attacks the gate oxide.

SUMMARY OF THE INVENTION

The present invention is devised in order to solve the problems as described above, in the conventional technology.

The object of the present invention is to provide a method of fabricating a metal (especially tungsten) gate electrode that does not require a separate glue layer as described in the conventional art.

Another object of the present invention is to provide a method for manufacturing a semiconductor device capable of increasing the stability of the boundary between a tungsten film and a gate oxide film and preventing the gate oxide from being damaged by fluorine during the tungsten deposition.

Still another object of the present invention is to provide a method for manufacturing a semiconductor device capable of radically preventing a tungsten oxide film from being undesirably formed by re-oxidation process after gate electrode patterning.

In accordance with one embodiment of the present invention for achieving the above objects, there is provided a method for manufacturing a semiconductor device comprising the steps of: forming a gate insulating film on a semiconductor device; forming a sacrifice polysilicon film on the gate insulating film; patterning the sacrifice polysilicon film to form a sacrifice polysilicon pattern; forming a first interlayer insulating film, wherein the first interlayer insulating film does not cover the surface of the sacrifice polysilicon pattern; etching the exposed sacrifice polysilicon pattern using the first interlayer insulating film as etch mask, resulting in reserving a predetermined thickness of sacrifice polysilicon pattern; and selectively forming a metal film on the reserved sacrifice polysilicon pattern, wherein the reserved sacrifice polysilicon pattern is mostly consumed while a metal film is formed. The method may further comprise the step of performing a cleaning process after the step of etching the exposed sacrifice polysilicon pattern, the step of performing a re-oxidation process after the step of patterning the sacrifice polysilicon film, or the step of forming insulating spacers at the vertical sides of the sacrifice polysilicon pattern prior to the step of forming the first interlayer insulating film. The metal film may be composed of tungsten and wherein the step of selectively forming a metal film may comprise a first tungsten deposition step of depositing a first tungsten film using $WF_6$ on the sacrifice polysilicon pattern; and a second tungsten deposition step of depositing a second tungsten film on the first tungsten film using $SiH_4$ or $H_2$ along with $WF_6$.

The step of forming the first interlayer insulating film may comprise the steps of: forming a first blanket interlayer insulating film; and etching in blanket the first blanket interlayer insulating film so as to expose the surface of the sacrifice polysilicon pattern. The step of forming the first blanket interlayer insulating film may comprise the steps of: depositing a silicon nitride film in blanket; and depositing a silicon oxide film in blanket on the silicon nitride film. The sacrifice polysilicon film is preferably a conductive doped film and the thickness of the reserved sacrifice polysilicon pattern after forming the metal film is preferably below 50 Å. Here, the thickness of the reserved sacrifice polysilicon pattern can be controlled to be 30 Å~300 Å after etching the exposed sacrifice polysilicon pattern.

Also, the method may further comprise the step of forming a second interlayer insulating film covering the first interlayer insulating film and the metal film. The step of forming a second interlayer insulating film comprises the steps of: depositing a silicon nitride film in blanket; and depositing a silicon oxide film on the silicon nitride film in blanket.

In summary, after a gate insulating film is formed on a semiconductor substrate, a predetermined thickness of sacrifice polysilicon film is deposited on the gate insulating film and the sacrifice polysilicon film is patterned, using a gate mask. Then a re-oxidation process can be performed and then insulating spacers are formed on the vertical sides of the sacrifice polysilicon pattern. Subsequently, a first interlayer insulating film is blanket-deposited on the overall surface of the semiconductor structure and then the first interlayer insulating film is etched by etchback or CMP (chemical mechanical polishing) to expose the sacrifice polysilicon pattern. Then, the exposed sacrifice polysilicon pattern is etched to form a recessed portion in which a predetermined thickness of sacrifice polysilicon pattern remains. Thus, the bottom of the recessed portion is the surface of the sacrifice polysilicon pattern. Only on the exposed remnant sacrifice polysilicon pattern, a metal film is deposited, in which the sacrifice polysilicon pattern located under the metal film is consumed for the reduction of $WF_6$ to W during the tungsten deposition. As a result, the tungsten film comes in direct contact with the gate insulating film so that a tungsten gate electrode is obtained.

The present invention as described above has advantages as follows. First, it can prevent the generation of pattern defects due to the oxidation of metal electrode by performing a re-oxidation process prior to the metal (or tungsten) deposition. Also, a thin sacrifice polysilicon pattern is used as a glue layer for metal film, a preventive film and a sacrifice film so that the boundary stability of the gate insulating film and the metal film is increased. Specially, when the metal is composed of tungsten, the present method can prevent the damage of gate insulating film and the underlying structure by the fluorine attack of $WF_6$.

BRIEF DESCRIPTION OF THE DRAWINGS

For a more complete understanding of the present invention and the advantage thereof, reference is now made to the following description taken in conjunction with the accompanying drawings in which.

DETAILED DESCRIPTION OF THE PRESENT INVENTION

The preferred embodiment of the present invention will hereinafter be described in detail with reference to the accompanying drawings.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. Also, The figures representing cross-sections of portions of an integrated circuit during fabrication are not drawn to scale, but instead are drawn so as to illustrate the important features of the invention.

FIGS. 1–7 are the cross sectional views of illustrating the method of fabricating a gate electrode in a semiconductor device in accordance with one preferred embodiment of the present invention.

Figure 1:
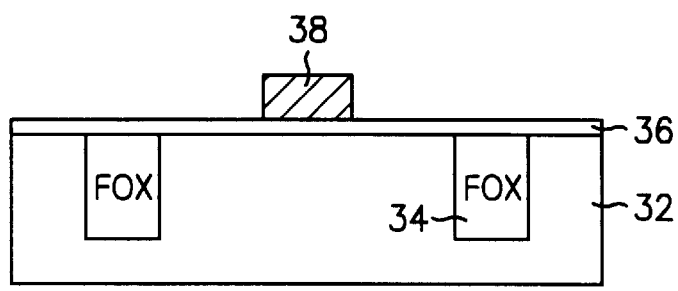
FIGS. 1–7 are the cross sectional views for illustrating the method of fabricating a gate electrode in a semiconductor device in accordance with one preferred embodiment of the present invention.

First, as shown in FIG. 1 field oxide layers 34 are formed in conventional technique (e.g. STI (shallow trench isolation) in a silicon substrate 32 and then a gate insulating film 36 is formed. A sacrifice polysilicon film of 300 Å~5000 Å in thickness is deposited on the gate insulating film 36 and then patterned, using a gate (or word line) mask (e.g. a gate electrode photoresist pattern). In this specification, the term 'gate electrode' can represent, for example, the gate of a MOS transistor, the emitter of a bipolar transistor, the local interconnect material of a MOS or bipolar transistor (e.g. the material formed over a doped region, such as a source region, to facilitate contact between the doped region and a contact plug), or the interconnect line between semiconductor devices.

Figure 2:
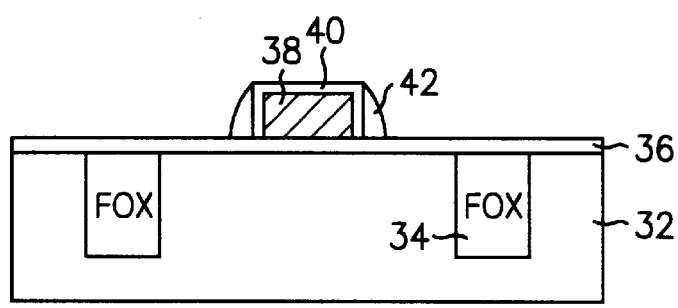

Subsequently, a thermal oxide film 40 is formed by re-oxidation process as shown in FIG. 2. The re-oxidation process recovers the deterioration of the gate insulating film 36 having been generated during the etching of the sacrifice polysilicon film 38. Also an insulating film (e.g. silicon nitride film) of 500 Å~3000 Å in thickness is deposited in blanket and anisotropically etched so as to form insulating spacers 42 on the vertical sides of the sacrifice polysilicon pattern 38.

Figure 3:
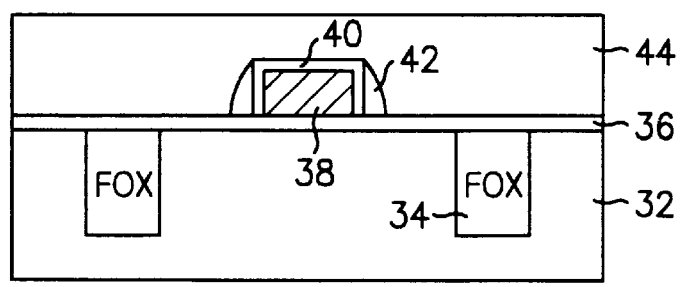

Then as shown in FIG. 3, a first interlayer insulating film 44 of 1000 Å~5000 Å in thickness is deposited on the overall surface of the semiconductor structure. In one preferred embodiment, the formation process of the first interlayer insulating film 44 includes the steps of depositing a silicon nitride film of 300 Å~2000 Å in thickness and depositing a silicon oxide film of the remnant thickness.

Figure 4:
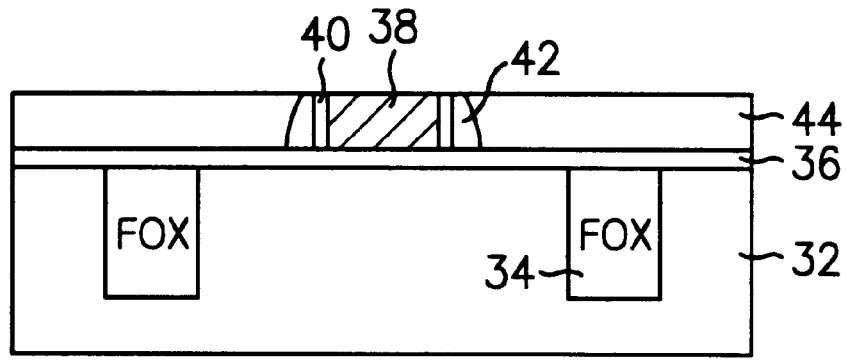
Figure 5:
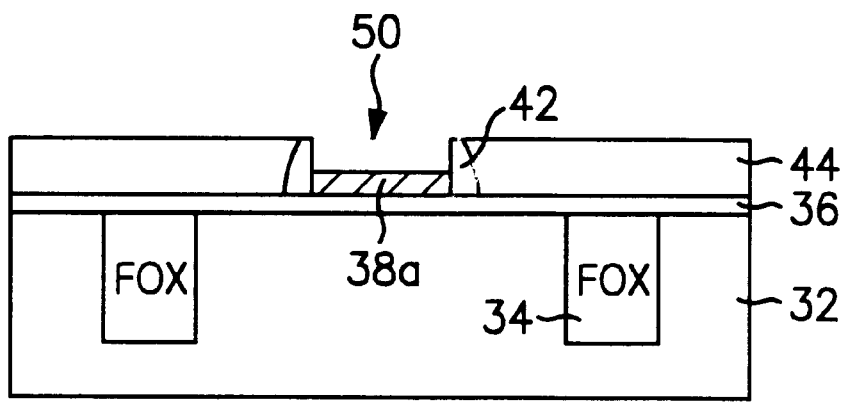

As depicted in FIG. 4, the first interlayer insulating film 44 is etched in blanket to the degree that the surface of the sacrifice polysilicon pattern 38 is exposed. The blanket etch of the first interlayer insulating film 44 can be performed by an etchback or CMP (chemical mechanical polishing) techniques. In preferred embodiments, the etchback process of the first interlayer insulating film 44 is accomplished under the condition of 5 mTorr~100 Torr in pressure, 100 W~10 KW using $C_xF_y$ and $O_2$. Also, when etchback it is detected by measuring an EOP (end of point) that the surface of the sacrifice polysilicon pattern 38 is exposed. In addition, for the etching of the first interlayer insulating film 44 by etchback 10–1000% overetch may be performed.

When the first interlayer insulating film 44 is blanket-etched by CMP, an additive CMP is performed in 5–200% after the surface of the sacrifice polysilicon pattern 38 is exposed.

After the blanket etch of the first interlayer insulating film 44 is completed, a dry etch by RIE (reactive ion etching) or a wet etch, using a silicon etchant may be performed for etching the sacrifice polysilicon pattern 38 so as to form a recess 50. It is preferable that the remnant sacrifice polysilicon pattern 38a of 30 Å~500 Å in thickness should remain at the bottom of the recess 50.

Figure 6:
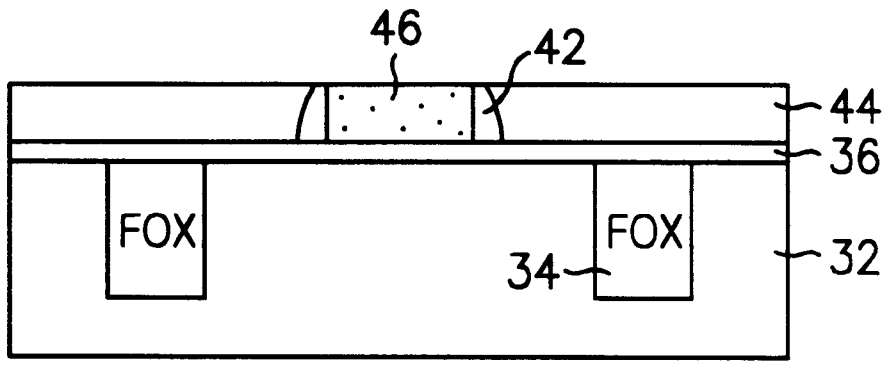

Then, as shown in FIG. 6, a tungsten film 46 of 300 Å~5000 Å in thickness is selectively deposited on the remnant sacrifice polysilicon pattern 38a. Here, the remnant sacrifice polysilicon pattern 38a is substantially consumed during the deposition of the tungsten film 46. As a result, after the completion of the tungsten film 46 deposition, there is a very little or no sacrifice polysilicon pattern.

In more detail, the selective deposition of tungsten may be performed, for example, by two steps as follows:

(1) The first tungsten deposition

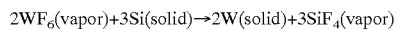

$2WF_6(vapor)+3Si(solid) \rightarrow 2W(solid)+3SiF_4(vapor)$ (2) The second tungsten deposition

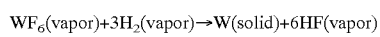

$WF_6(vapor)+3H_2(vapor) \rightarrow W(solid)+6HF(vapor)$

In the first tungsten deposition, the remnant sacrifice polysilicon pattern 38a is mostly consumed for forming the tungsten film in reaction to $WF_6$. In addition, it is preferable that a predetermined little thickness (e.g. 50 Å or below) of remnant sacrifice polysilicon pattern 38a should remain after the tungsten deposition for the protection of the gate insulating film 36 located under the gate electrode. This can be accomplished by controlling the time of the first tungsten deposition or by controlling the remaining thickness of the sacrifice polysilicon pattern 38a after the etching thereof as explained in FIG. 5.

Also, the reaction of the first tungsten deposition occurs only on the surface of the remnant sacrifice polysilicon pattern 38a, but does not occur on the surface of the first interlayer insulating film 44. Thus, the selective deposition of tungsten film can be made as shown in FIG. 6.

The second tungsten deposition can be performed by VD (chemical vapor deposition) using $WF_6$ and $H_2$ gas as illustrated in the above equation. The second tungsten deposition can be also accomplished using $WF_6$ and $Si_4H$. Further, it is preferable that a cleaning process should be made using HF or BOE (buffered oxide etchant) prior to the deposition of the tungsten film 46 in order to improve the selectivity of the tungsten deposition.

Figure 7:
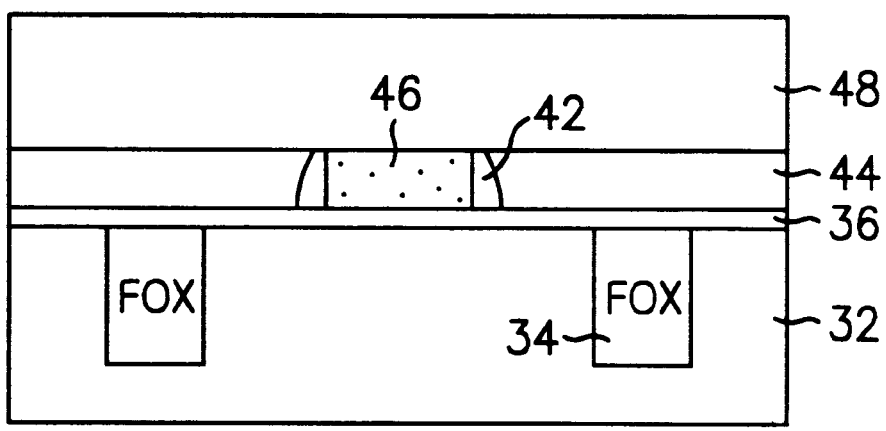

Subsequently, as shown in FIG. 7, the second interlayer insulating film 48 is formed on the resultant semiconductor structure, resulting in completing the formation of the gate electrode (or word line). The second interlayer insulating film 48 may be deposited by PECVD (plasm enhanced chemical vapor deposition) using $SiH_4$ or TEOS at 200° C.~600° C. Otherwise, the second interlayer insulating film 48 is preferably formed by CVD using TEOS and $O_3$ at 20° C.~600° C. or is composed of double structure of silicon nitride film and silicon oxide film.

The present invention is capable of forming a tungsten gate electrode, solving the problem caused by re-oxidation in the conventional technology. In other words, the re-oxidation for recovering the damage caused by patterning the gate polysilicon is performed before the formation of tungsten film, so that the generation of a tungsten oxide film by re-oxidation can be basically suppressed. In addition, the sacrifice polysilicon pattern 38 is mostly consumed during the tungsten deposition, thereby reducing the overall resistivity of the gate electrode as well as improving the boundary stability between the tungsten film and the gate oxide. Further, the present invention can overcome the damage of gate oxide film and its underlying structures by fluorine permeation during the tungsten deposition.

The metal gate electrode such as tungsten, having much higher conductivity than polysilicon, silicide or the like can be implemented, resulting in maximizing the operation speed of the semiconductor device.

Although preferred embodiments of the present invention has been illustrated and described, various alternatives, modifications and equivalents may be used. Therefore, the foregoing description should not be taken as limiting the scope of the present invention which is defined by the appended claims.

What is claimed is:

1. A method for manufacturing a semiconductor device comprising the steps of:
   forming a gate insulating film on a semiconductor device;
   forming a sacrifice polysilicon film on the gate insulating film;
   patterning the sacrifice polysilicon film to form a sacrifice polysilicon pattern;
   forming a first interlayer insulating film, wherein said first interlayer insulating film does not cover the surface of the sacrifice polysilicon pattern;
   etching the exposed sacrifice polysilicon pattern using the first interlayer insulating film as etch mask, resulting in reserving a predetermined thickness of sacrifice polysilicon pattern; and
   selectively forming a metal film on the reserved sacrifice polysilicon pattern, wherein the reserved sacrifice polysilicon pattern is mostly consumed while a metal film is formed and wherein the metal film is composed of tungsten and the step of selectively forming a metal film comprises: a first tungsten deposition step of depositing a first tungsten film using $WF_6$ on the sacrifice polysilicon pattern; and a second tungsten deposition step of depositing a second tungsten film on the first tungsten film using $SiH_4$ or $H_2$ along with $WF_6$.

2. The method of the claim 1, further comprising the step of performing a cleaning process after the step of etching the exposed sacrifice polysilicon pattern.

3. The method of the claim 1, further comprising the step of performing a re-oxidation process after the step of patterning the sacrifice polysilicon film.

4. The method of the claim 1, further comprising the step of forming insulating spacers at the vertical sides of the sacrifice polysilicon pattern prior to the step of forming the first interlayer insulating film.

5. The method of the claim 1, wherein the step of forming the first interlayer insulating film comprises the steps of:
   forming a first blanket interlayer insulating film; and
   etching in blanket the first blanket interlayer insulating film so as to expose the surface of the sacrifice polysilicon pattern.

6. The method of the claim 5, wherein the step of forming the first blanket interlayer insulating film comprises the steps of:
   depositing in blanket a silicon nitride film; and
   depositing in blanket a silicon oxide film on the silicon nitride film.

7. The method of the claim 1, wherein said sacrifice polysilicon film is a conductive doped film and the thickness of the reserved sacrifice polysilicon pattern after forming the metal film is below 50 Å.

8. The method of the claim 7, wherein the thickness of the reserved sacrifice polysilicon pattern is 30 Å~300 Å after etching he exposed sacrifice polysilicon pattern.

9. The method of the claim 1, further comprising the step of forming a second interlayer insulating film covering the first interlayer insulating film and the metal film.

10. The method of the claim 9, wherein said step of forming a second interlayer insulating film comprises the steps of:
    depositing in blanket a silicon nitride film; and
    depositing in blanket a silicon oxide film on the silicon nitride film.

11. A method for manufacturing a gate electrode of a semiconductor device comprising the steps of:
    forming a gate insulating film on a semiconductor substrate;
    forming a sacrifice polysilicon film on the gate insulating film;
    patterning the sacrifice polysilicon film so as to form a sacrifice polysilicon pattern;
    performing a re-oxidation process in order to recover the damage of the gate insulating film caused by the step of patterning the sacrifice polysilicon film;
    forming a first interlayer insulating film in blanket;
    etching in blanket the first interlayer insulating film so as to expose the surface of the sacrifice polysilicon pattern;
    etching the exposed sacrifice polysilicon pattern so that a predetermined thickness of sacrifice polysilicon pattern is reserved;
    selectively depositing a tungsten film on the reserved sacrifice polysilicon pattern, wherein the step of selectively depositing the tungsten film comprises the steps of:

a first tungsten deposition step of depositing a first tungsten film using $WF_6$ on the reserved sacrifice polysilicon pattern; and a second tungsten deposition step of depositing, a second tungsten film on the first tungsten film using $SiH_4$ or $H_2$ along with $WF_6$; and forming a second interlayer insulating film in blanket.

12. The method of the claim 11, further comprising the step of performing a cleaning process prior to the step of selectively depositing the tungsten film.

* * * * *